United States Patent [19]
Yang et al.

[11] Patent Number: 5,501,996
[45] Date of Patent: Mar. 26, 1996

[54] METHOD OF MANUFACTURE OF HIGH COUPLING RATIO SINGLE POLYSILICON FLOATING GATE EPROM OR EEPROM CELL

[75] Inventors: Sheng-Hsing Yang, Hsinchu; Jyh-Kuang Lin, I-Lan, both of Taiwan

[73] Assignee: United Microelectronics Corporation, Hsinchu, Taiwan

[21] Appl. No.: 355,670

[22] Filed: Dec. 14, 1994

[51] Int. Cl.⁶ .............................................. H01L 21/8247
[52] U.S. Cl. .................. 437/43; 437/203; 148/DIG. 168
[58] Field of Search ................................ 437/43, 66, 203; 148/DIG. 168

[56] References Cited

U.S. PATENT DOCUMENTS 4,222,062  9/1980  Trotter et al. .................. 148/DIG. 168
5,376,572  12/1994  Yang et al. ............................ 437/43
5,395,777  3/1995  Yang ................................. 437/203

Primary Examiner—Chandra Chaudhari
Attorney, Agent, or Firm—George O. Saile; Graham S. Jones, II

[57] ABSTRACT

A MOSFET semiconductor, erasable programmable ROM device on a lightly doped semiconductor substrate comprising field oxide regions in the semiconductor substrate. The field oxide regions extends down into sunken regions in the substrate through the openings. At least one of the field oxide regions is removed from the substrate to provide an opened one of the sunken regions in the substrate below the removed one of the field oxide regions. Ion implanted regions lie in the substrate below the openings. A gate oxide layer over the opened sunken region, and a floating gate over the gate oxide layer. Preferably, a tunnel oxide region is formed on the surface of the device with the floating gate overlying the tunnel oxide region to form an EEPROM device. The exposed sunken region has a V-shaped cross section sunken region extending deep into the substrate.

30 Claims, 8 Drawing Sheets

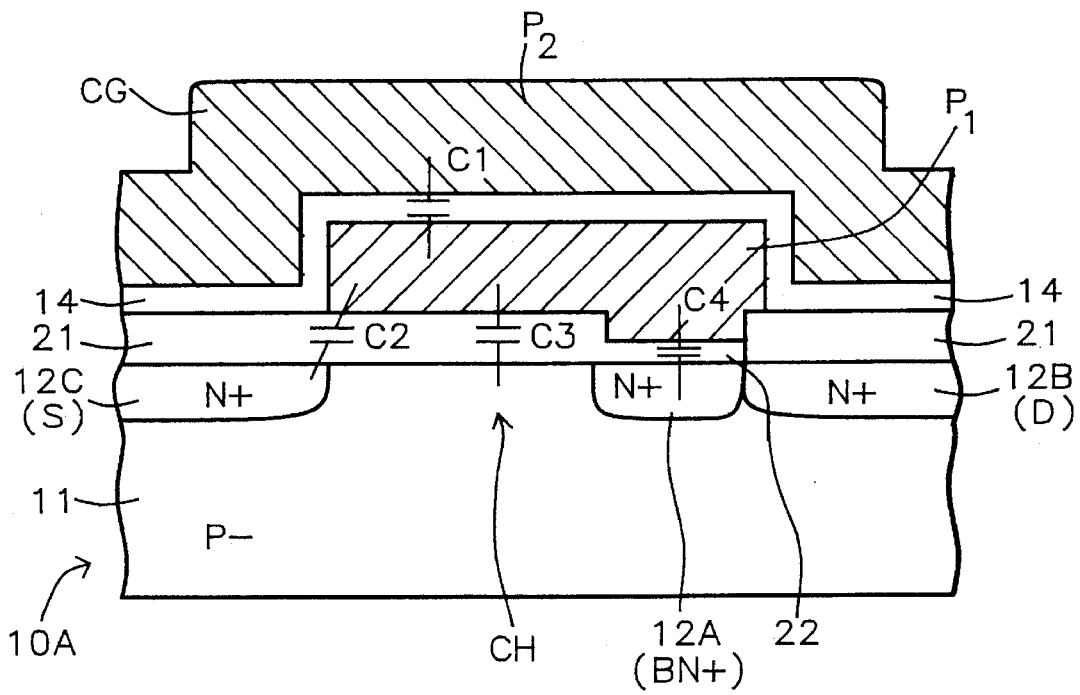
FIG. 10 – Prior Art
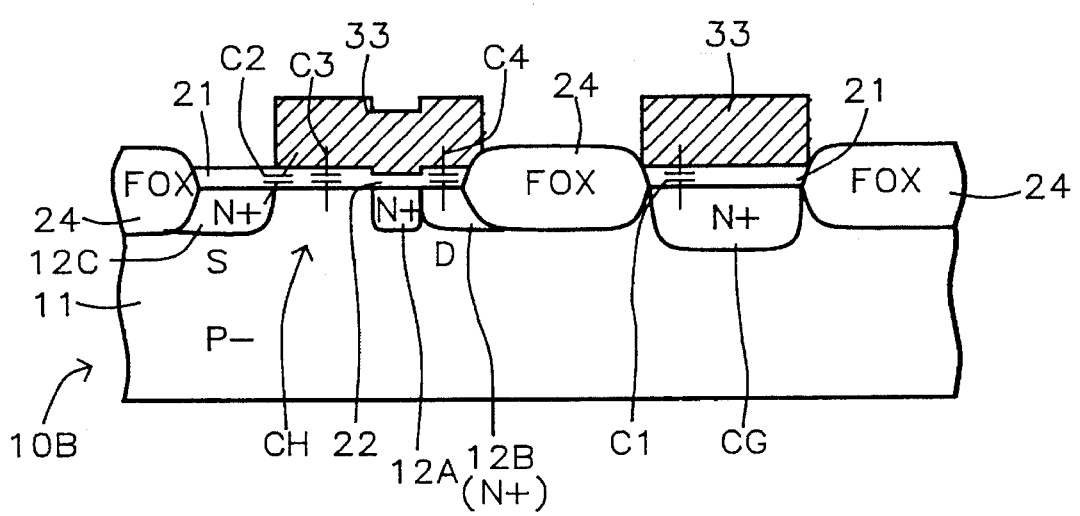
FIG. 11 – Prior Art

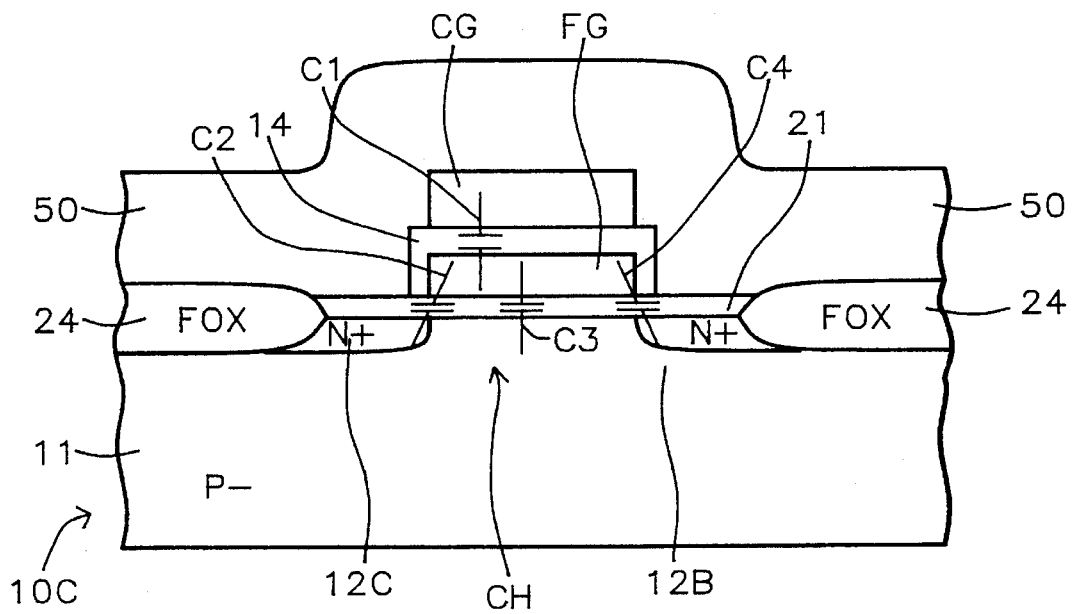
*FIG. 12 - Prior Art*
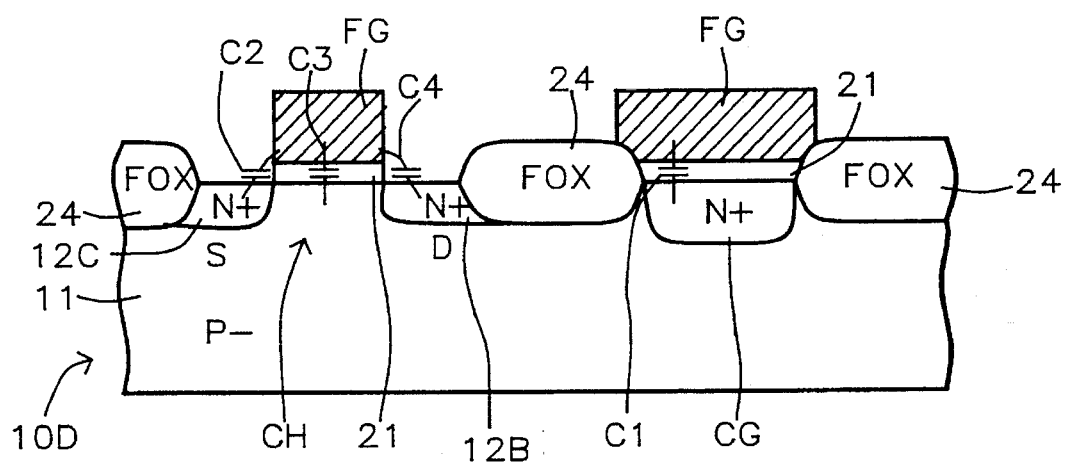
*FIG. 13 - Prior Art*

1

METHOD OF MANUFACTURE OF HIGH COUPLING RATIO SINGLE POLYSILICON FLOATING GATE EPROM OR EEPROM CELL

BACKGROUND OF THE INVENTION

1. Field of the Invention

This invention relates to semiconductor memory devices and more particularly to methods of manufacture thereof.

2. Description of Related Art

Referring to FIG. 10, a sectional view of a prior art device 10A is shown with a P− semiconductor substrate 11 having a buried N+ region 12A formed therein immediately next to an N+ drain region 12B. Although buried N+ region 12A and N+ drain regions 12B are ion implanted at different times, those regions are in electrical contact. A channel region CH in substrate 11 is defined between buried N+ region 12A and a source N+ region 12C, which is to the left of channel region CH in substrate 11. The N+ source region 12C is doped the same degree as N+ drain region 12B. Above most of the substrate 11 is a gate oxide layer 21, except that above buried N+ region 12A is a tunnel oxide region 22.

Polysilicon 1 floating gate P1 is formed over the gate oxide layer 21 and the tunnel oxide region 22 extending down into the pocket left in gate oxide layer 21 by thin tunnel oxide region 22. Formed over entire device 10A, described above, including gate oxide layer 21 and floating gate P1 is interpolysilicon (silicon dioxide or ONO) dielectric layer 14 upon which is formed a polysilicon 2 control gate structure P2 extending across the entire device 10A.

Polysilicon 2 structure P2, which serves as a control gate, is coupled through capacitor $C_1$ to the polysilicon 1 floating gate P1, which is coupled in turn by capacitors $C_2$, $C_3$ and $C_4$ to the source region 12C, channel region CH, and BN+ region 12A. Capacitor $C_2$ is connected to the source region (S) 12C, capacitor $C_3$ is connected to the channel region CH, and capacitor $C_4$ is connected to buried N+ region 12A which is directly connected to the drain region (D) 12B.

Coupling Ratio

The problem with the device 10A of FIG. 10 is that it provides a low coupling ratio. The coupling ratio as used here is defined as follows:

$$\text{Coupling Ratio } (CR) = \frac{C_1}{C_1 + C_2 + C_3 + C_4} \quad (1)$$

$$C_1 = \frac{A\epsilon_{ox}}{t_{ox}} \text{ where}$$

A=area of capacitor plates (cm$_2$)

$\epsilon_{ox}$=permittivity of silicon dioxide =3.9F/cm $t_{ox}$=thickness of silicon dioxide (cm)

Obviously, the coupling ratio CR can be increased by increasing the capacitance $C_1$ or decreasing the total of the sum of capacitances $C_1+C_2+C_3+C_4$. However, in the case of FIG. 10, the value of C1 is limited because the surface area of the floating gate capacitor C1 (which is formed between control gate P2 and floating gate P1) is limited.

Referring to FIG. 11, a sectional view of another EEPROM prior art device 10B is shown. A P− semiconductor substrate 11 has a buried N+ region 12A formed therein immediately next to and in electrical contact with N+ drain region 12B.

2

Regions 12A and 12B are ion implanted at different times and the regions 12A and 12B are in electrical contact. Across the channel region CH is an N+ source region 12C next to a first FOX region. To the right of the drain region 12B is a second FOX region 24, and to the right of the second FOX region is a buried N+ control gate region CG to the right of which is a third FOX region 24.

Above most of the substrate 11 between the three FOX regions 24 is a gate oxide layer 21, except that above buried N+ region 12A is a tunnel oxide region 22.

Polysilicon 1 floating gate 33 is formed over the gate oxide layer 21 and the tunnel oxide region 22 extending down into, the pocket left in gate oxide layer 21 by the thin tunnel oxide region 22.

Control gate CG is coupled through capacitor $C_1$ (not shown) to the polysilicon 1 floating gate 33, which is coupled in turn by capacitors $C_2$, $C_3$ and $C_4$ to the source region 12C, channel region CH, and BN+ region 12A. Capacitor $C_2$ is connected to the source region S, capacitor $C_3$ is connected to the channel region CH, and capacitor $C_4$ is connected to drain region 12B and the buried N+ region 12A.

Referring to FIG. 12, a sectional view of an EPROM prior art device 10C is shown. A P− substrate 11 has an N+ drain region 12B, channel region CH, and N+ source region 12C located between a pair of FOX regions 24 in FIG. 12.

Covering the substrate 11 between two FOX regions 24 (formed in and on the surface of substrate 11) is a gate oxide layer 21. Above gate oxide layer 21 is a floating gate FG covered by interpolysilicon (silicon dioxide or ONO) dielectric layer 14. Above interpolysilicon (silicon dioxide or ONO) dielectric layer 14 is a control gate CG. The entire device 10C of FIG. 12 is covered with a blanket BPSG glass layer 50.

Control gate CG is coupled through capacitor $C_1$ to the polysilicon 1 floating gate FG which is coupled in turn by capacitors $C_2$, $C_3$ and $C_4$ to the source region 12C, channel region CH, and drain region 12B. In detail capacitor $C_2$ is connected to the source region S, capacitor $C_3$ is connected to the channel region CH, and capacitor $C_4$ is connected to drain region 12B.

Referring to FIG. 13, a sectional view of an EPROM prior art device 10D is shown. A P− substrate 11 has an N+ drain region 12B, channel region CH, and N+ source region 12C between the left two of three FOX regions 24.

Above all of the substrate 11 between the three FOX regions 24 (formed in and on the surface of substrate 11) is a gate oxide layer 21. Above gate oxide layer 21 is a floating gate FG. Below the right section of gate oxide layer 21 is a buried N+ region, control gate CG.

Control gate CG is coupled through capacitor $C_1$ to the polysilicon 1 floating gate FG which is coupled in turn by capacitors $C_2$, $C_3$ and $C_4$ to the source region 12C, channel region CH, and drain region 12B. In detail capacitor $C_2$ is connected to the source region S, capacitor $C_3$ is connected to the channel region CH, and capacitor $C_4$ is connected to drain region 12B.

U.S. Pat. No. 5,108,937 of Tsai et al for "Method of Making a Recessed Gate MOSFET Device Structure" forms regions referred to therein as "sunken silicon oxide areas" formed by the LOCOS process, one area of which "defines the gate electrode locations". Other areas "define field silicon oxide areas." The gate electrode locations are formed by removing the silicon oxide by use of selective etching in those areas where they are to be formed. Then a a gate silicon oxide layer is formed, followed by forming a conductive layer over the gate silicon oxide layer, in place of the removed sunken silicon oxide. The device forms a recessed gate, but does not relate to formation of a portion of an EPROM device in the former FOX region or to the solution to the problem of enhancing the coupling ratio of such devices.

Generally, a single polysilicon floating gate EPROM/EEPROM device has a lower coupling ratio, so it must have a higher programming voltage to compensate for the low coupling ratio.

SUMMARY OF THE INVENTION

An object of this invention is to manufacture high density semiconductor EPROM/EEPROM memory devices with a high coupling ratio.

In accordance with this invention a field oxidation process is used. Then a mask is used to perform an etch back process to form an opening in at least one field oxide region. Next, the opening is used to form a buried control gate in this etch back region. Then, an ion implant process is used to form buried N+ regions followed by formation of a gate oxide layer. For the purpose of increasing the control gate region area, and also increasing the coupling ratio thereby permitting reduction of the programming voltage.

In accordance with this invention, a method is provided for manufacturing a MOSFET semiconductor, erasable programmable ROM device on a lightly doped semiconductor substrate. A mask is formed upon the substrate with openings therein. Regions of silicon dioxide are formed in the semiconductor substrate through the openings in the mask. The regions of silicon dioxide extend down into sunken regions in the substrate. The silicon dioxide is removed from the substrate forming at least one opening in a sunken region in the substrate. Ions are introduced into the substrate below the sunken region to form a buried control gate conductor region therein. A second layer of silicon dioxide is formed over the buried control gate conductor region. A floating gate structure is formed over the second layer of silicon dioxide to form the erasable programmable ROM device.

Preferably, the mask comprises silicon nitride. The mask is formed over a pad oxide on the substrate and the substrate comprises lightly doped silicon. The oxide comprises silicon dioxide field oxide. The field oxide is removed by etching, thereby exposing the sunken region for the control gate region. The substrate is etched through the exposed sunken region forming a V-shaped cross section sunken region extending deeper into the substrate. A tunnel oxide region is formed on the surface of the device with the floating gate overlying the tunnel oxide region to form an EEPROM device. The introduction of ions into the substrate is performed by ion implantation. The second layer of silicon dioxide comprises a field oxide.

In accordance with another aspect of manufacturing a MOSFET semiconductor, an erasable programmable ROM device device on a lightly doped semiconductor substrate is made by a method including forming a mask upon the substrate with openings therein. Field oxide regions are formed in the semiconductor substrate, the field oxide regions extending down into sunken regions in the substrate through the openings in the mask. Then at least one of the field oxide regions is removed from the substrate to provide an opened one of the sunken regions in the substrate below the removed one of the field oxide regions. Ions are introduced into the substrate through the openings in the mask. A gate oxide layer is formed over the opened sunken region, and a floating gate is formed over the gate oxide layer.

Preferably, the mask comprises silicon nitride. The mask is formed over a pad oxide on the substrate and the substrate comprises lightly doped silicon. A tunnel oxide region is formed on the surface of the device with the floating gate overlying the tunnel oxide region to form an EEPROM device. The introduction of ions into the substrate is performed by ion implantation. The field oxide is removed by etching, thereby exposing the sunken regions. Then the substrate is etched through the exposed sunken region forming a V-shaped cross section sunken region extending deeper into the substrate; wherein an aqueous KOH solution forms the V-shaped cross section sunken region. A tunnel oxide region is formed on the surface of the device with the floating gate overlying the tunnel oxide region to form an EEPROM device.

BRIEF DESCRIPTION OF THE DRAWINGS

The foregoing and other aspects and advantages of this invention are explained and described below with reference to the accompanying drawings, in which:

FIGS. 1A and 1B, 2, 7, 8A, 8B and 9 show the process flow for a third and a fourth process for producing a device in accordance with this invention.

FIGS. 5 and 9 are sections taken along line 5B–5B' in FIG. 6 showing devices made in accordance with this invention. The remainder of the drawings show sections taken along line 1A–1A' in FIG. 6.

FIG. 10 shows a sectional view of a prior art device.

FIG. 11 is a sectional view of another EEPROM prior art device.

FIG. 12 shows a sectional view of an EPROM prior art device.

FIG. 13 is another sectional view of an EPROM prior art device.

DESCRIPTION OF THE PREFERRED EMBODIMENT

FIGS. 1A and 1B, 2, 3, 4A, 4B and 5 show the process flow for a first and a second process for producing a device in accordance with this invention.

FIGS. 1A and 1B, 2, 7, 8A, 8B and 9 show the process flow for a third and a fourth process for producing a device in accordance with this invention.

EEPROM DEVICE

Figure 1A:
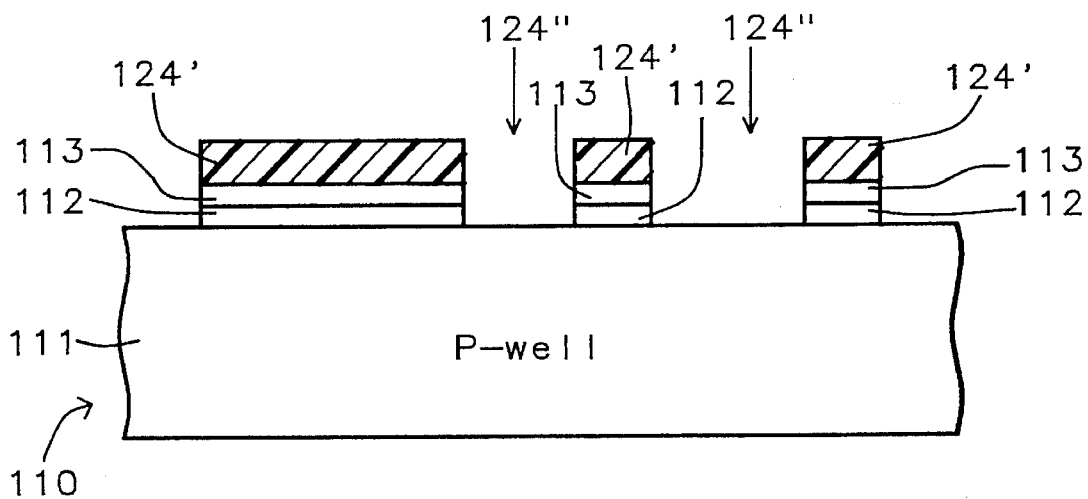
FIGS. 1A and 1B, 2, 3, 4A, 4B and 5 show the process flow for a first and a second process for producing a device in accordance with this invention.

FIG. 1A shows a P-well formed in a silicon semiconductor substrate 111 of a device 110 that incorporates a first dopant for semiconductors, preferably in a concentrations between about $1 \times 10^{13}$ atoms/cm$^3$ to $1 \times 10^{17}$ atoms/cm$^3$. The substrate is preferably monocrystalline silicon, although polycrystalline silicon, III-V compound semiconductors, silicon on insulator (SOI), silicon on sapphire (SOS) etc. could possibly be utilized. The dopant, which is preferably P–, can be either P or N, depending upon the type of MOSFET desired to be made as is well understood in the art.

The P– well region 111 is formed in silicon substrate 111 of a device 110 by a conventional process. The P-well 111 has an average dopant concentration of between about $1 \times 10^{16}$ atoms/cm$^3$ to $1 \times 10^{17}$ atoms/cm$^3$.

Next a pad oxide layer 112 is formed. Referring again to FIG. 1A, above the P– well region 111, the surface of substrate 30 is oxidized by a conventional process to form a silicon dioxide (pad oxide which is a stress relief thermal oxide) layer 112 to a thickness in the range of about 200 Å to about 500 Å. Still referring to FIG. 1A, in the next step, a blanket silicon nitride masking layer 113 is formed by a conventional process having a thickness in the range of about 1,000 Å to about 2,000Å.

In the following step a conventional field oxide diffusion photoresist mask 124' with openings 124" therein is formed on device 110 for the purpose of providing a pattern for FOX regions 124 (shown in FIG. 2) to be formed subsequently.

Figure 2:
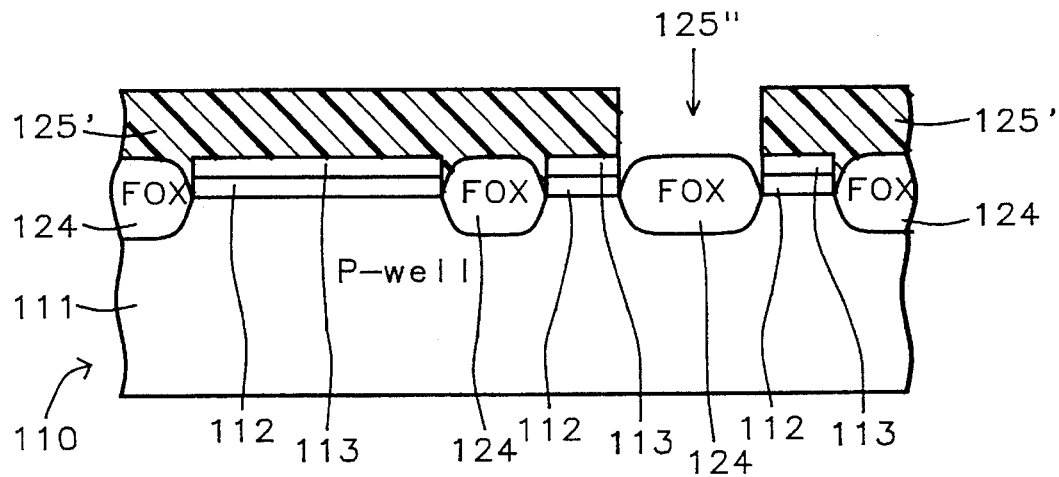

Silicon nitride layer 113 is then etched through openings 124" in mask 124' down to pad oxide layer 112, as shown in FIG. 2. Portions of the silicon nitride layer 124 are removed by using standard lithography and etching techniques to form mask 113 with openings 124" therethrough.

Figure 1B:
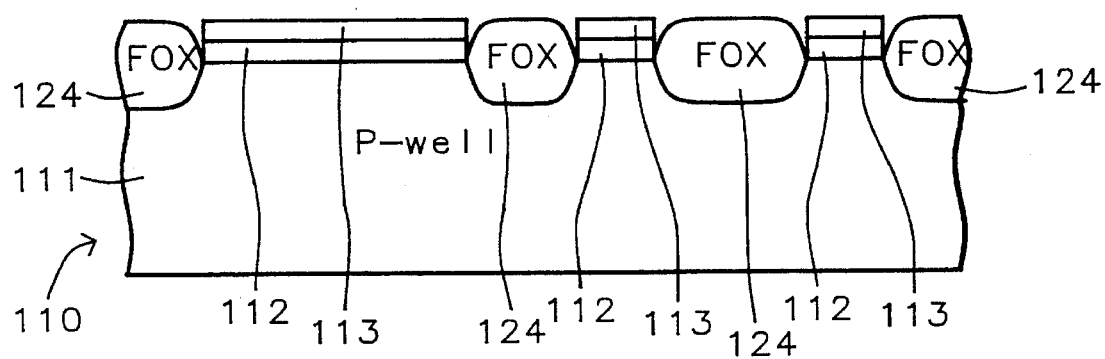

Then mask 124' is stripped as seen in FIG. 1B.

Referring to FIG. 1B, a process of field oxidation through openings 124" in silicon nitride masking layer 113 forms an set of conventional field oxide (FOX) regions 124 (shown in FIG. 1B) in the openings 124" and therebelow near the surface of the P-well 111. The silicon dioxide FOX regions 124 have an overall thickness of between about 500 nanometers to about 1,000 nanometers. The process used is the well known LOCOS process which forms silicon dioxide FOX regions 124 on P-well 111 through openings 124" by placing device 110 in an oxidizing ambient environment.

Referring to FIG. 2, a control gate photoresist mask 125' is formed on device 110 with opening 125" provided therein for making a control gate opening in the surface of device 111 in place of one of the FOX regions 124.

Figure 3:
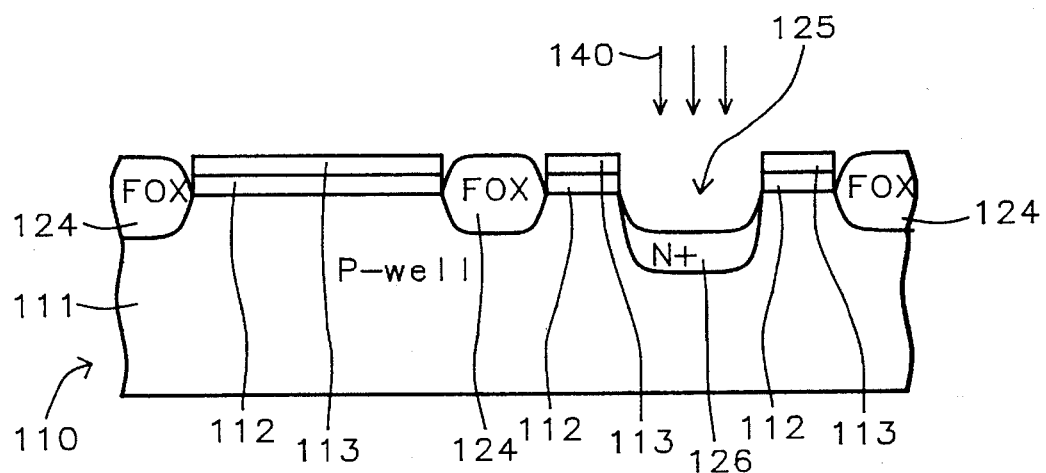

A field (silicon dioxide) etch back step follows. Referring to FIG. 3, etching back of silicon dioxide FOX region 124 through opening 125" forms a hollowed out, concave or pan cross section opening forming a region 125 down to P-well 111 by means on a conventional etch back process. The opening on the surface of region 125 has a far greater surface area than the prior art flat surface of P-well 11 of FIGS. 10–13, which it replaces.

Figure 7:
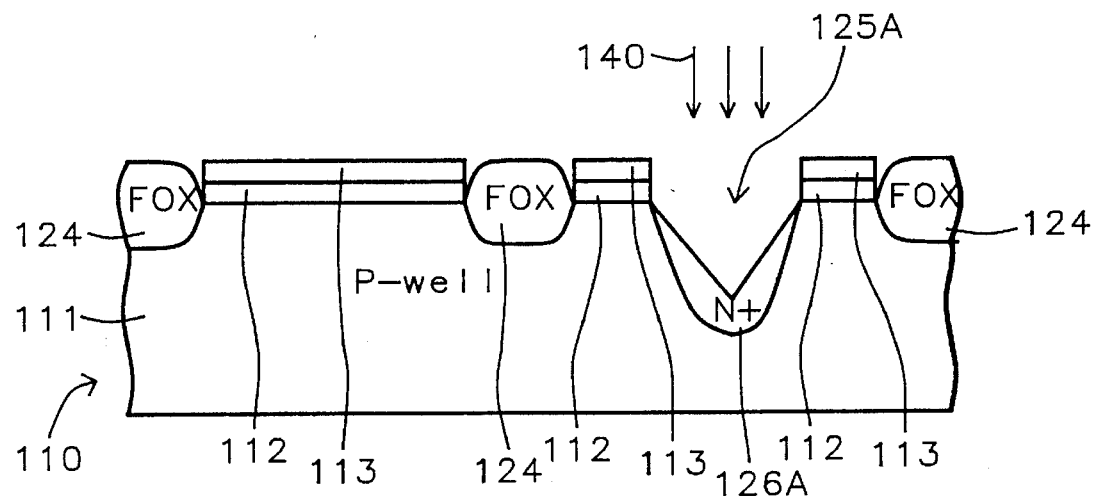

Optional KOH etching of P-well 111 follows. Referring to FIG. 7, after the etch back, KOH can be used to etch silicon P-well 111. The KOH etching forms a V-shape cross section of the opening in the form of a region 125A. The opening on the surface of region 125A has a substantially increased surface area as compared with the surface area of region 125.

Referring to FIG. 3 in a buried N+ implant step, buried N+ ions 140 are introduced through the opening into region 125 into a new buried control gate region 126 in this etch back region 125.

Referring to FIG. 7 in an alternative buried N+ implant step, buried N+ ions 140 are introduced through V-shape opening 125A into a new control gate region 126A.

In the case of both FIGS. 3 and 7 N+ ions 140 are introduced into P-well 111 by ion implantation near the newly exposed, depressed surface of P-well 111 preferably in a concentration between about $1\times10^{16}$ to $1\times10^{17}$ atoms/$cm^3$ with a dopant of arsenic (As) ions implanted at between about $1\times10^{15}$ atoms/$cm^2$ to about $5\times10^{15}$ atoms/$cm^2$ at an energy between about 50 keV to about 80 keV.

Referring again both FIGS. 3 and 7, after the buried N+ implant, the next step is a process of driving in the dopant ions 140 into P-well 111.

Figure 4A:
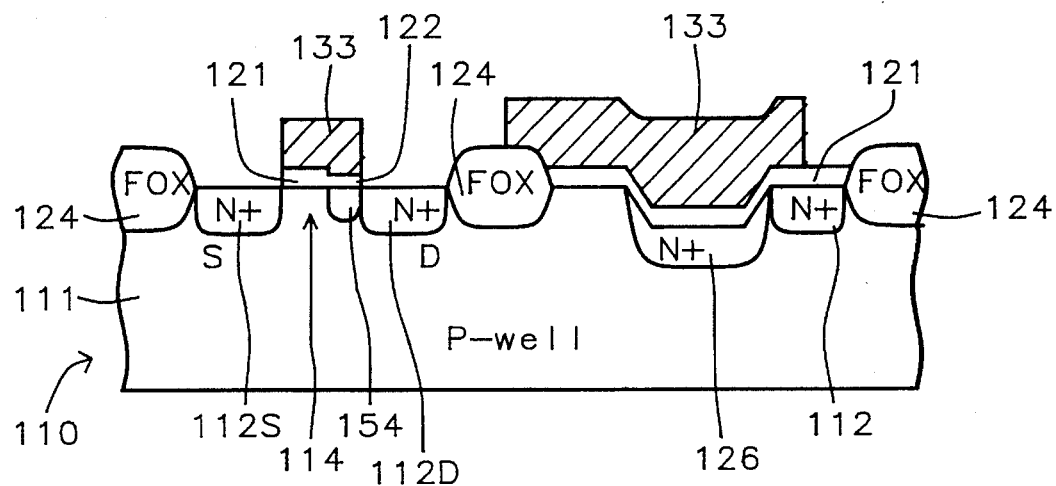
Figure 4B:
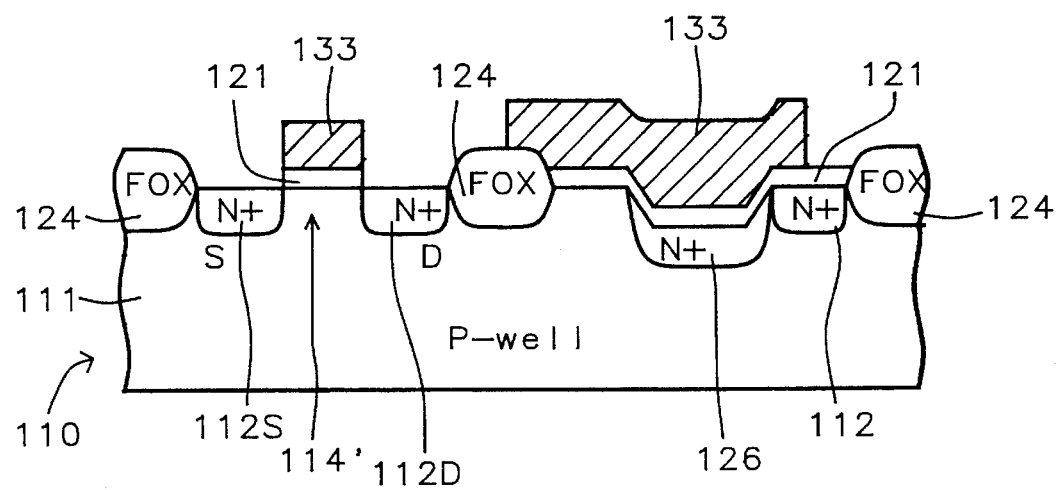
Figure 8A:
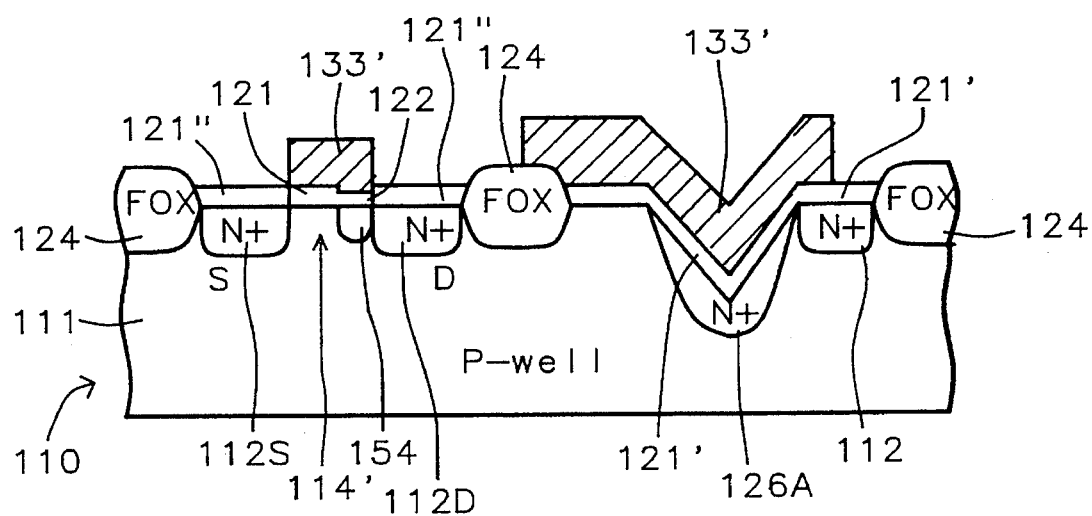
Figure 8B:
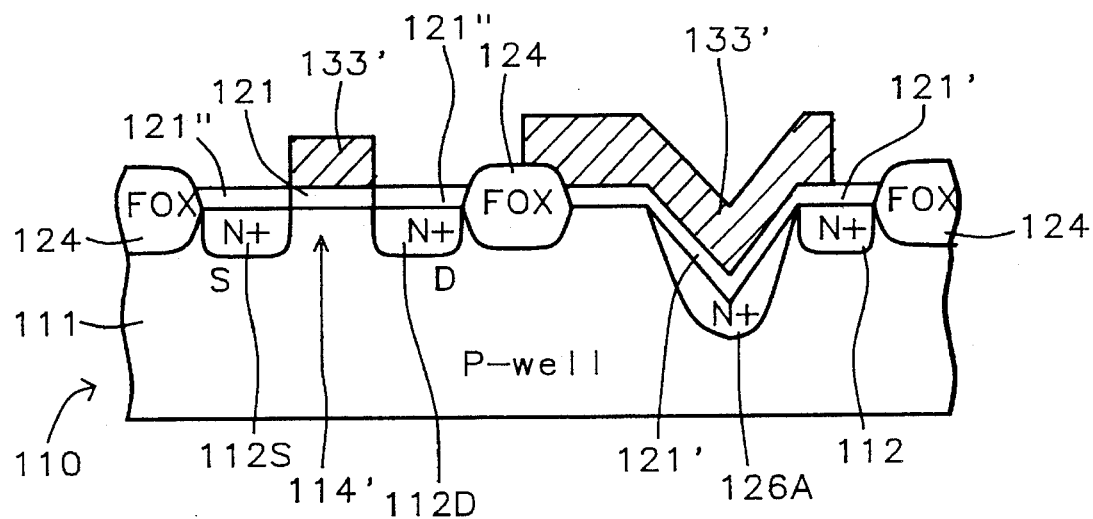

Removal of silicon nitride mask 113 and pad oxide 112 follows. FIGS. 4A, 4B, 8A and 8B show the four different process variations which follow the products of FIG. 3 and FIG. 7. FIGS. 4A and 4B, which follow FIG. 3, show the result of forming the floating gate 133, without the KOH etching step of FIG. 7. FIGS. 8A and 8B, which follow FIG. 7 show the result of forming the floating gate 133' after the KOH etching step. The silicon dioxide can be neglected. The silicon nitride mask 113 and pad oxide 112 are removed.

Referring to FIGS. 4A and 4B after removal of layers 112 and 113, a gate oxide layer 121 is formed by oxidation of silicon on the newly exposed surface of P-well 111 of device 110 except over FOX regions 124 and source/drain regions 112S and 112D.

Referring to FIGS. 8A and 8B after removal of layers 112 and 113, a gate oxide layer 121' is formed by oxidation of silicon on the newly exposed surface of P-well 111 of device 110 except over FOX regions 124 and source/drain regions 112S and 112D. In those regions over source/drain regions 112S and 112D a gate oxide layer 121" is be added in a conventional manner.

In the case of an EEPROM device, there is a need for a tunnel oxide mask for removing the gate oxide 121 over the desired locus of N type doped region 154 in FIGS. 4A and 8A. For FIGS. 4A and 8A there is a masking step for patterning an opening 122' in the pattern of a tunnel oxide mask with opening 122' as shown in which is illustrated in FIG. 6.

Figure 6:
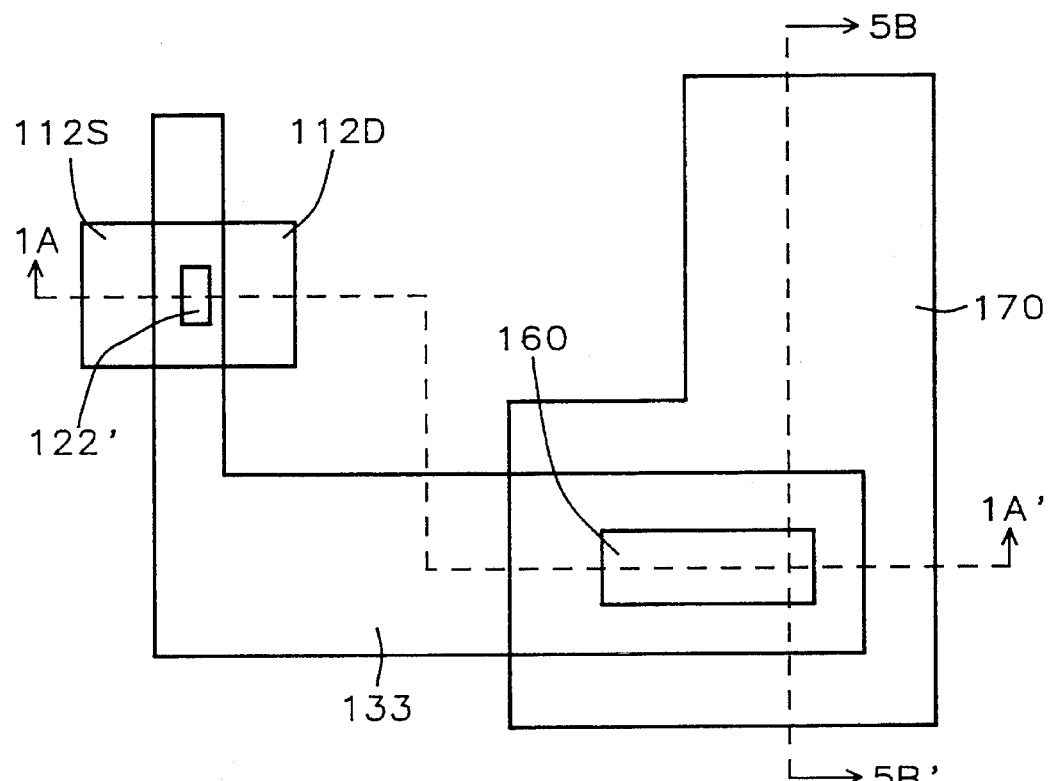
FIG. 6 shows the plan view of the devices described above.

Referring again to FIGS. 4A and 8A, gate oxide layer 121 is etched back below opening 122' as shown in FIG. 6 over region 154 (for the EEPROM device) into which a tunnel oxide region 122 is to be formed, which is to be formed as described below.

Referring again to FIGS. 6, 4A and 8A tunnel oxide layer 122 (option for EEPROM device) having a thickness of about about 100 Å is formed through the opening 122' in the tunnel oxide mask.

Then, the back end process follows. In the case of FIGS. 4A and 4B, a polysilicon floating gate layer 133 is formed over gate oxide layer 121. Alternatively, as shown in FIGS. 8A and 8B, a polysilicon floating gate layer 133' is formed over the gate oxide layer 121. The tunnel oxide layer 122 shown in FIGS. 4A and 8A is formed in the conventional manner for the simple etch back of FOX region 124 in FIGS. 4A and 4B as well as the deep V-shaped etch back in FIGS. 8A and 8B. In addition, the floating gate layer 133 (FIGS. 4A, 4B), 133' (FIGS. 8A, 8B) is doped in accordance with the conventional manner. The N+ region 154 (for the EEPROM device) is shown in FIGS. 4A and 8A.

EPROM DEVICE

The process for formation of an EPROM device in accordance with this invention is largely identical to that for an EEPROM device as described above. In particular, the process steps which follow are identical including: well formation, pad oxide, silicon nitride deposition, the diffusion mask, silicon nitride etching, field oxidation, control gate mask, oxide etching, KOH vs. shape, buried N+ implant, drive-in, removal of silicon nitride and pad oxide, gate oxidation except that the gate oxide layer 121 is about 200 Å thick for an EPROM device. However a tunnel oxide mask, gate oxide etching, and the tunnel oxide option for an EEPROM device are not needed for an EPROM device.

Figure 5:
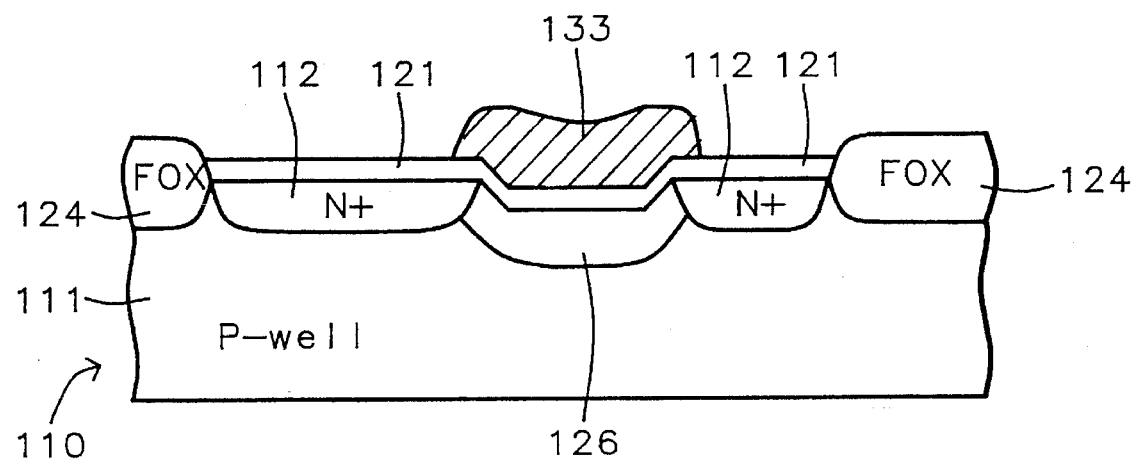
Figure 9:
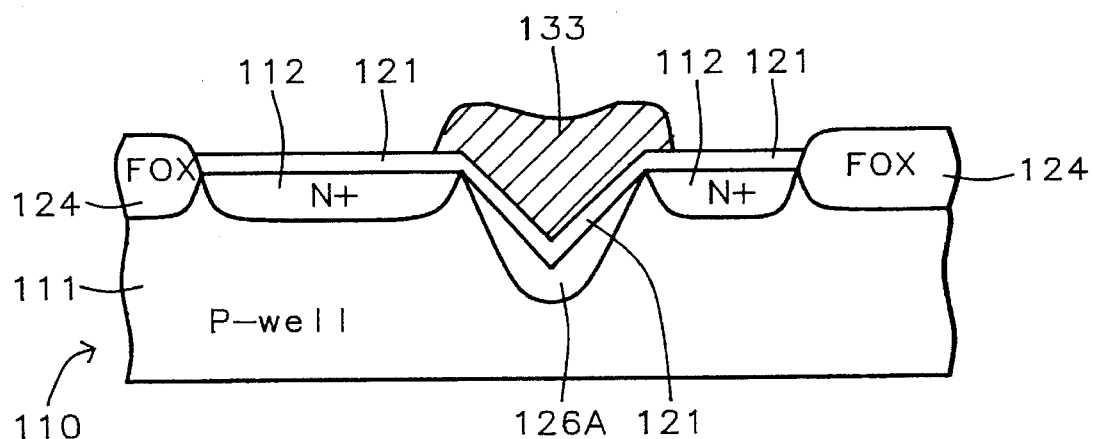

FIG. 6 shows the plan view of the devices described above. FIGS. 5 and 9 shown the devices with sections taken along line 5B–5B' in FIG. 6. The remainder of the drawings show sections taken along line 1A–1A' in FIG. 6. In FIG. 6 region 160 is the field oxide region which must be etched back to form the depressed region 125 or the V-shaped region 125A. Region 170 is the diffusion region of the device 110.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing an erasable programmable ROM device on a lightly doped semiconductor substrate having a surface, said method comprising the sequence of steps as follows:

forming a mask upon said substrate with openings therein, forming regions of silicon dioxide in said semiconductor substrate through said openings in said mask, said regions of silicon dioxide extending down into sunken regions in said substrate, removing said silicon dioxide from said substrate forming at least one opening in a sunken region in said substrate, introduction of ions into said substrate below said sunken region to form a buried control gate conductor region in said substrate, forming a gate oxide layer over said buried control gate conductor region in said substrate, and forming a gate structure over said gate oxide layer to form said erasable programmable ROM device.

2. A method in accordance with claim 1 wherein said mask comprises silicon nitride.

3. A method in accordance with claim 2 wherein said mask is formed over a pad oxide on said substrate and said substrate comprises lightly doped silicon.

4. A method in accordance with claim 3 wherein said silicon dioxide comprises field oxide.

5. A method in accordance with claim 4 wherein said field oxide is removed by etching, thereby exposing said sunken region for said control gate region.

6. A method in accordance with claim 5 wherein said substrate is etched through said exposed sunken region forming a V-shaped cross section sunken region extending deeper into said substrate.

7. A method in accordance with claim 6 wherein a tunnel oxide region is formed on said surface of said semiconductor substrate with said gate structure overlying said tunnel oxide region to form an EEPROM device.

8. A method in accordance with claim 7 wherein said introduction of ions into said substrate is performed by ion implantation.

9. A method in accordance with claim 1 wherein a tunnel oxide region is formed on said surface of said semiconductor substrate with said gate structure overlying said tunnel oxide region to form an EEPROM device.

10. A method in accordance with claim 9 wherein said regions of silicon dioxide comprise a field oxide.

11. A method of manufacturing an erasable programmable ROM device on a lightly doped semiconductor substrate having a surface, said method comprising the sequence of steps as follows:

forming a pad oxide layer on said substrate, forming a mask upon said substrate with openings therein, forming field oxide regions in said semiconductor substrate, said field oxide regions extending down into sunken regions in said substrate through said openings in said mask, removing at least one of said field oxide regions from said substrate to provide an opened one of said sunken regions in said substrate below said removed one of said field oxide regions, introducing ions into said substrate through said openings in said mask to form a buried control gate region, forming a gate oxide layer over said opened sunken region, and forming a gate layer over said gate oxide layer.

12. A method in accordance with claim 11 wherein said mask comprises silicon nitride.

13. A method in accordance with claim 12 wherein said mask is formed over a pad oxide on said substrate and said substrate comprises lightly doped silicon.

14. A method in accordance with claim 13 wherein a tunnel oxide region is formed on said surface of said semiconductor substrate with said gate layer overlying said tunnel oxide region to form an EEPROM device.

15. A method in accordance with claim 14 wherein said field oxide is removed by etching, thereby exposing said sunken regions.

16. A method in accordance with claim 15 wherein said substrate is etched through said exposed sunken region forming a V-shaped cross section sunken region extending deeper into said substrate.

17. A method in accordance with claim 16 wherein said substrate is etched with an aqueous KOH solution to form said V-shaped cross section sunken region.

18. A method in accordance with claim 17 wherein said introduction of ions into said substrate is performed by ion implantation.

19. A method in accordance with claim 11 wherein said substrate is etched through said exposed sunken region forming a V-shaped cross section sunken region extending deeper into said substrate with an aqueous KOH solution to form said V-shaped cross section sunken region.

20. A method in accordance with claim 19 wherein a tunnel oxide region is formed on said surface of said semiconductor substrate with said gate layer overlying said tunnel oxide region to form an EEPROM device.

21. A method of manufacturing an EEPROM memory device on a lightly doped semiconductor substrate having a surface, said method comprising the sequence of steps as follows:

forming a first oxide layer on said substrate, forming a silicon nitride mask upon said first oxide layer with openings therein, forming openings in said silicon nitride mask, etching through said openings in said silicon nitride mask down to said semiconductor substrate, forming field oxide regions in portions of said semiconductor substrate exposed through said silicon nitride mask, said field oxide regions extending down into sunken regions in said substrate through said openings in said mask, removing at least one of said field oxide regions from said substrate to provide an opened one of said sunken regions in said substrate below said removed one of said field oxide regions, introducing ions into said substrate through said openings in said mask, removing said silicon nitride mask, removing said first oxide layer exposing said surface of said substrate aside from said field oxide regions, and forming a gate oxide layer over said surface of said substrate including the surface of said opened sunken region, forming a mask with tunnel oxide mask opening over said gate oxide layer, etching a tunnel oxide opening through said tunnel oxide mask opening down to said surface of said substrate, forming a tunnel oxide layer through said tunnel oxide mask opening on said surface of said substrate, and forming a gate structure over said gate oxide layer and said tunnel oxide layer.

22. A method of manufacturing an erasable programmable EEPROM device on a lightly doped semiconductor substrate having a surface, said method comprising the sequence of steps as follows:

forming a pad oxide layer on said substrate, forming a first mask upon said pad oxide layer with openings therein, forming openings in said first mask, etching through said openings in said first mask down to said semiconductor substrate, forming field oxide regions in portions of said semiconductor substrate exposed through said first mask, said field oxide regions extending down into sunken regions in said substrate through said openings in said first mask, removing at least one of said field oxide regions from said substrate to provide an opened one of said sunken regions in said substrate below said removed one of said field oxide regions, introducing ions into said substrate through said openings in said first mask, removing said first mask, removing said pad oxide layer exposing said surface of said substrate, forming a gate oxide layer over said surface of said substrate including the surface of said opened sunken region, forming a mask with tunnel oxide mask opening over said gate oxide layer, etching a tunnel oxide opening through said tunnel oxide mask opening down to said surface of said substrate, forming a tunnel oxide layer through said tunnel oxide mask opening on said surface of said substrate, forming a floating gate structure over said gate oxide layer and over said tunnel oxide layer.

23. A method in accordance with claim 22 wherein said first mask comprises silicon nitride.

24. A method in accordance with claim 23 wherein said mask is formed over a pad oxide on said substrate and said substrate comprises lightly doped silicon.

25. A method in accordance with claim 24 wherein said field oxide is removed by etching, thereby exposing said sunken regions.

26. A method in accordance with claim 25 wherein said substrate is etched through said exposed sunken region forming a V-shaped cross section sunken region extending deeper into said substrate.

27. A method in accordance with claim 26 wherein said substrate is etched with an aqueous KOH solution to form said V-shaped cross section sunken region.

28. A method in accordance with claim 27 wherein said introduction of ions into said substrate is performed by ion implantation.

29. A method in accordance with claim 22 wherein said substrate is etched through said exposed sunken region forming a V-shaped cross section sunken region extending deeper into said substrate with an aqueous KOH solution to form said V-shaped cross section sunken region.

30. A method in accordance with claim 29 wherein a tunnel oxide region is formed on said surface of said semiconductor substrate with said floating gate overlying said tunnel oxide region to form an EEPROM device.

* * * * *